United States Patent [19]

Grolleau et al.

[11] Patent Number: 5,099,332
[45] Date of Patent: Mar. 24, 1992

[54] GRID TUBE WITH INCREASED EFFICIENCY

[75] Inventors: Claude Grolleau, Thonon les Bains/Allinges; Guy Peillex-Delphe, Evian les Bains; Pierre Gerlach, Thonon les Bains, all of France

[73] Assignee: Thomson Tubes Electroniques, Boulogne Billancourt, France

[21] Appl. No.: 614,126

[22] Filed: Nov. 16, 1990

[30] Foreign Application Priority Data

Dec. 8, 1989 [FR] France .................. 89 16266

[51] Int. Cl.⁵ .................. H04N 5/14; H04N 5/38; H04N 9/16
[52] U.S. Cl. .................. 358/184; 358/186; 358/64
[58] Field of Search .................. 358/64, 184, 186; 330/127, 128, 130

[56] References Cited

U.S. PATENT DOCUMENTS

| | | |
|---|---|---|
| 2,500,831 | 3/1950 | Kerkhof . |
| 2,881,394 | 4/1959 | Ernyei . |
| 2,903,585 | 9/1959 | Thanos .................. 330/128 |
| 3,027,519 | 3/1962 | Davis .................. 330/128 |
| 3,435,359 | 3/1969 | Sennhenn .................. 330/130 |
| 3,598,906 | 8/1971 | Uetake .................. 358/192.1 |
| 3,598,913 | 8/1971 | Emmasingel .................. 358/169 |
| 3,648,179 | 3/1972 | Ikegami et al. .................. 358/28 |
| 3,742,292 | 6/1973 | Gerlach .................. 315/39 |
| 3,930,179 | 12/1975 | Gerlach .................. 313/296 |
| 3,943,398 | 3/1976 | Gerlach .................. 313/341 |
| 3,995,188 | 11/1976 | Gerlach .................. 313/348 |
| 4,017,760 | 4/1977 | Benoit et al. .................. 315/39 |
| 4,031,394 | 6/1977 | Felix et al. .................. 313/388 |
| 4,311,975 | 1/1982 | Benoit et al. .................. 333/207 |
| 4,563,609 | 1/1986 | Clerc et al. .................. 313/345 |
| 4,571,525 | 2/1986 | Gerlach et al. .................. 313/539 |
| 4,639,633 | 1/1987 | Holt et al. .................. 313/35 |
| 4,644,217 | 2/1987 | Holt et al. .................. 313/35 |
| 4,910,476 | 3/1990 | Benoit et al. .................. 330/76 |

FOREIGN PATENT DOCUMENTS

| | | |
|---|---|---|
| 747334 | 12/1944 | Fed. Rep. of Germany . |
| 789537 | 8/1935 | France . |
| 851465 | 10/1939 | France . |
| 67351 | 4/1982 | Japan . |
| 114510 | 7/1983 | Japan . |
| 444050 | 4/1936 | United Kingdom . |

*Primary Examiner*—John K. Peng
*Attorney, Agent, or Firm*—Oblon, Spivak, McClelland, Maier & Neustadt

[57] ABSTRACT

The present invention concerns a grid amplifier tube producing with an approximately constant gain at least a combination of a first signal for a short duration and a second signal for a longer duration. The maximum voltage of the first signal is higher than the maximum voltage of the second signal. To improve the efficiency of the tube, the anode polarization voltage is adjusted to a level enabling the tube to operate as a class B, AB or C amplifier and to produce the maximum voltage of the second signal but not the maximum voltage of the first signal. The class of the amplifier is made to vary towards class A for the duration of the first signal so that it produces the maximum voltage of the first signal. For this purpose at least one of the polarization voltages of the electrodes of the tube is made to vary. The present invention finds particular application to television transmitters operating in negative transmission systems.

10 Claims, 3 Drawing Sheets

FIG_1
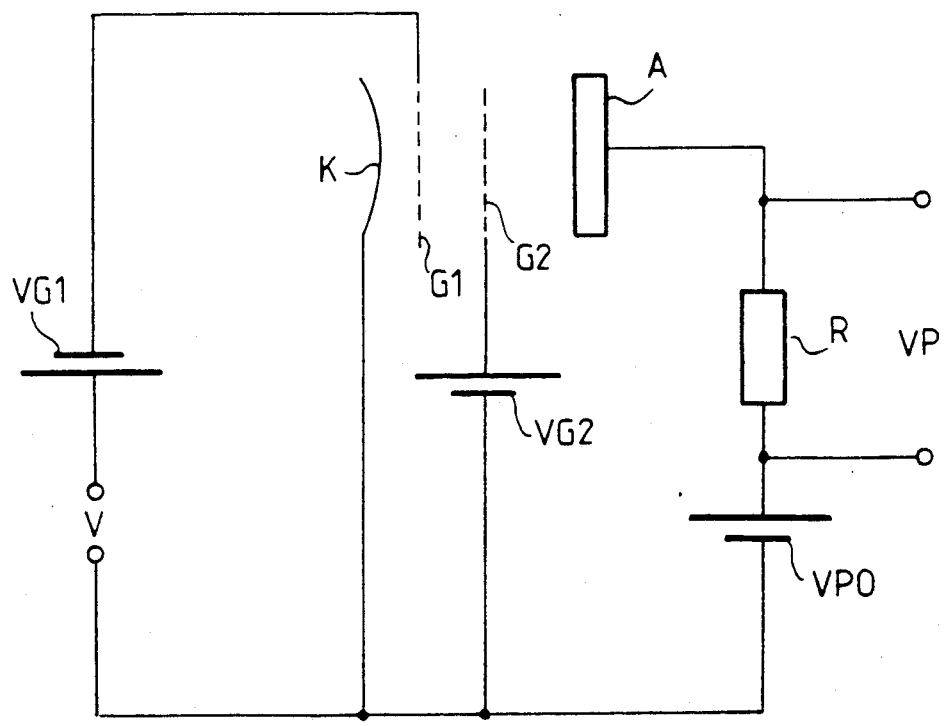

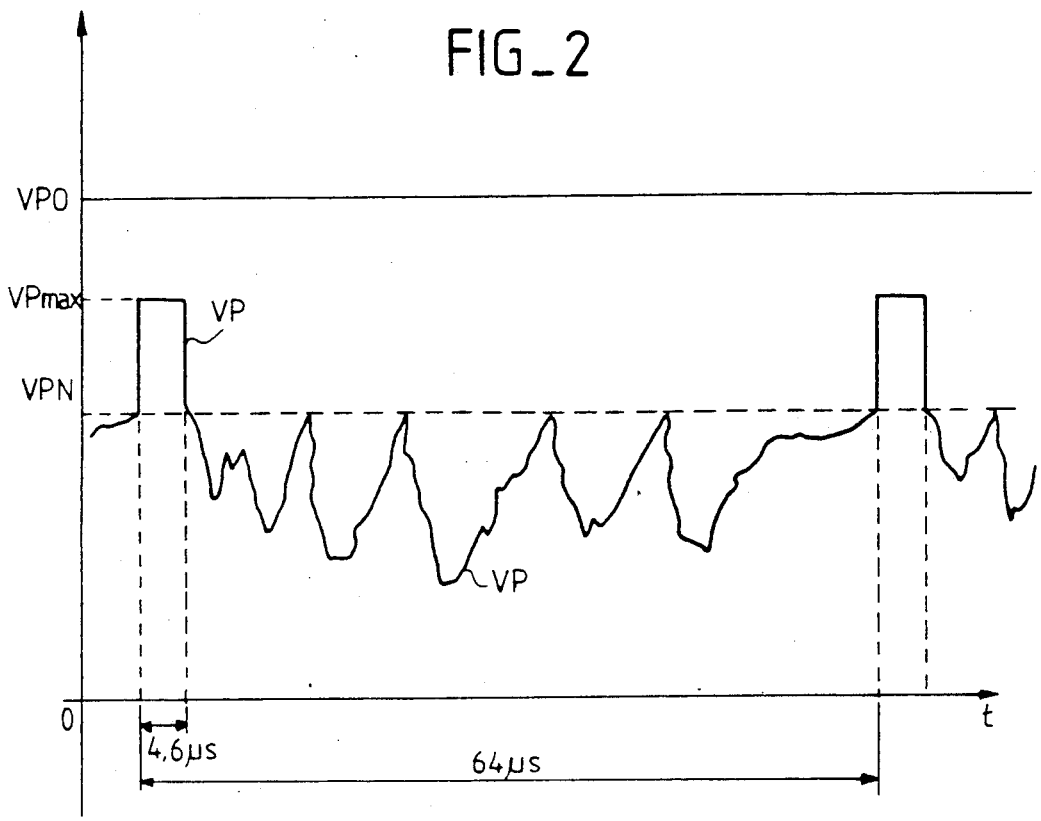
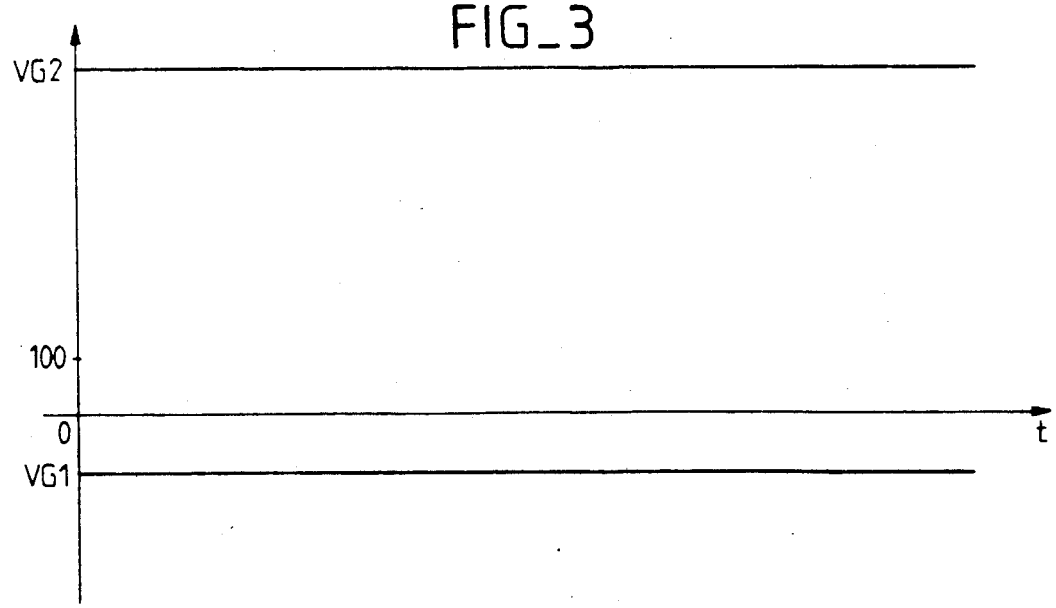

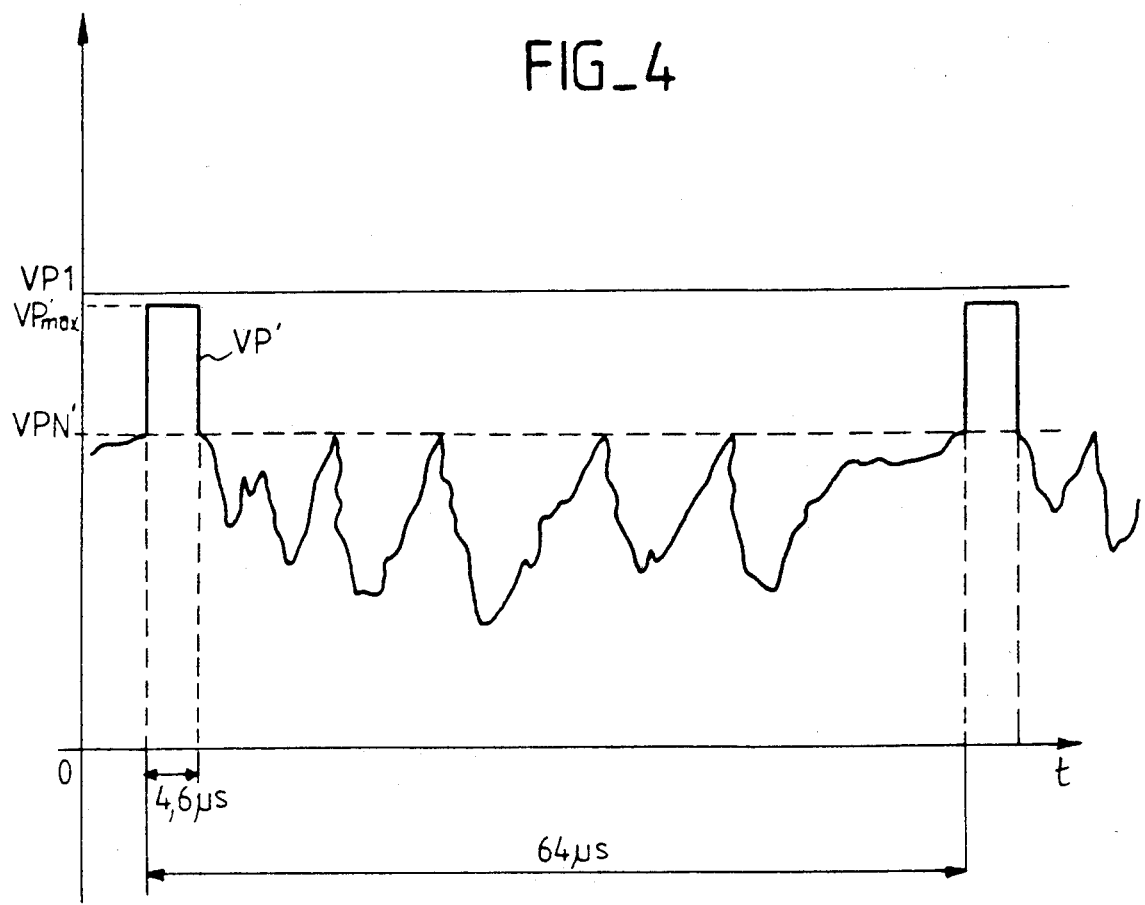
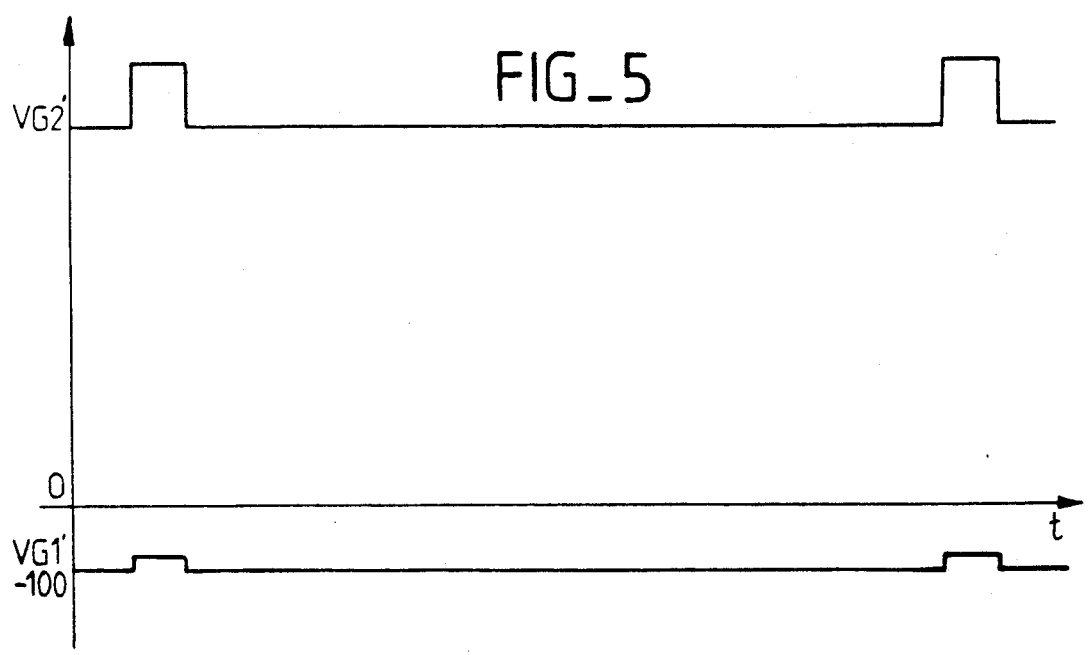

GRID TUBE WITH INCREASED EFFICIENCY

BACKGROUND OF THE INVENTION

The present invention concerns electron tubes with at least one grid, used as amplifiers, which produce signals with a great variation in amplitude. Its object is to improve their efficiency.

It concerns more particularly tubes for television emitters using negative transmission. Most countries in Europe and even throughout the world use negative transmission. France, Luxembourg and some other countries use positive transmission.

The tubes used in television emitters are generally tetrodes. The invention can of course apply to other grid tubes such as triodes, pentodes, etc.

The amplifier tubes used as television emitters generally operate as class B amplifiers. The invention can also apply to tubes operating as class AB, B or C amplifiers.

A triode is a tube with a cathode emitting electrons, an anode or plate and a single grid, known as a control grid, placed between the cathode and the anode.

A tetrode has an additional grid known as a screen grid, placed between the control grid and the anode.

A pentode has one grid more than the tetrode, this grid known as a suppressor grid is and is inserted between the screen grid and the anode.

A television transmitter emits a video signal comprising notably the repetition of the following two signals: a synchronization signal and a video line signal. The period of repetition of these two signals is about 64 microseconds in 625-line systems.

The synchronization signal is an approximately rectangular pulse with a duration of about 4.6 microseconds. This duration is very short compared with the repetition period. The line video signal lasts for the rest of the repetition, i.e. about 59.4 microseconds.

In a negative transmission system the transmitter's maximum power is delivered during the synchronization signal. The maximum level of the video line signal corresponds to black, and the minimum level of the video line signal corresponds to white.

In a positive transmission system, on the other hand, the synchronization signal corresponds to the minimum power of the transmitter. The maximum level of the video line signal corresponds to white and the minimum level to black.

Hereinafter we shall refer only to negative transmission systems.

In order to obtain a sufficiently powerful synchronization signal at the output from the transmitter, the anode of the tube must receive a high polarization voltage which is much higher than the voltage necessary to obtain the power corresponding to black.

This polarization voltage serves only during the synchronization signal and is unnecessarily high for the whole duration of the video line signal.

The tube's efficiency is proportional to the ratio of the voltage of the video signal emitted by the tube to the polarization voltage of the anode. As the duration of emission of the line signal is much longer than the duration of emission of the synchronization signal, the overall efficiency of the tube is practically that of the video line signal. And this efficiency is very poor owing to the unnecessarily high polarization voltage.

SUMMARY OF THE INVENTION

The present invention aims to remedy this disadvantage by proposing a grid tube with improved efficiency. It applies to all amplifier tubes producing at least a combination of a first short-duration signal and a second longer-duration signal, the maximum voltage of the first signal being higher than the maximum voltage of the second signal.

For this purpose the anode polarization voltage is reduced to a level sufficient to obtain the maximum voltage of the second signal.

However, a prior the reduced anode polarization voltage no longer enables the maximum voltage of the first signal to be obtained. The gain of the tube then falls during the first signal, which is not desirable.

To remedy this fall in gain, the tube is made to act more as a class A tube during the first signal.

The present invention proposes a grid amplifier tube with an anode and at least one control grid each supplied by a polarization voltage, producing with approximately constant gain at least a combination of a first short-duration signal and a second longer-duration signal, the maximum voltage of the first signal being higher than the maximum voltage of the second signal, characterized by the facts that: the anode polarization voltage is adjusted to a level enabling the tube to act as a class B, AB or C tube and to produce the maximum voltage of the second signal but not that of the first signal, and that a means enables the tube to act more as a class A tube during the first signal so that the tube can produce the maximum voltage of the first signal.

In order to make the tube operate as class A, at least one of the polarization voltages is made to vary. For example, if the tube comprises a screen grid, this can be connected to a modulated polarization voltage. This voltage then includes a pulse of positive amplitude whose duration is that of the first signal.

The tube's control grid can also be connected to a modulated polarization voltage. This voltage then comprises a pulse of positive amplitude whose duration is that of the first signal. The anode of the tube can also be connected to a modulated polarization voltage. This voltage then comprises a pulse of positive amplitude whose duration is that of the first signal. The modulated polarization voltages can also be combined in pairs or all together.

The invention applies notably to television transmitters operating in negative transmission and whose amplifier tube produces a video signal which is at least a combination of a short-duration synchronization signal and a longer-duration video line signal. In this application, the maximum voltage of the video line signal corresponds to the color black.

BRIEF DESCRIPTION OF THE DRAWINGS

The invention will be better understood and other advantages will appear on reading the following detailed description which refers to the appended drawings, in which:

FIG. 1 represents a circuit diagram of a tetrode mounted as an amplifier;

FIG. 2 represents, as a function of time, the voltage VP of a video signal and the anode polarization voltage VPO applied to a conventional tetrode used as a television transmitter;

FIG. 3 represents, as a function of time, the polarization voltages VG1, VG2 applied to the control grid and the screen grid respectively of the tetrode in FIG. 2;

FIG. 4 represents, as a function of time, the voltage VP' of a video signal and the anode polarization voltage VP1 applied to a tetrode according to the invention, used as a television transmitter;

FIG. 5 represents, as a function of time, the polarization voltages VG1', VG2' applicable to the control grid and the screen grid respectively of the tetrode in FIG. 4.

DESCRIPTION OF THE PREFERRED EMBODIMENT

The diagram of a conventional tetrode tube mounted as an amplifier is represented in FIG. 1. This tube includes a cathode K intended to emit electrons, a control grid G1 connected to a polarization voltage VG1, a screen grid G2 connected to a polarization voltage VG2 and an anode A or plate connected to a polarization voltage VPO. Hereinafter we shall designate by the same reference a source of voltage and the voltage it produces. A voltage V corresponding to the signal to be amplified is applied to the grid G1. A resistor R is mounted between the anode A and the source of voltage VPO. At the terminals of this resistor appears a voltage VP which corresponds to the voltage V after amplification.

The polarization voltages are direct voltages. The voltage VG1 is negative with respect to the potential of the cathode K.

When the tetrode is used as an amplifier in a television transmitter, it produces a video signal VP comprising notably the repetition of the following two signals: a synchronization signal and a video line signal. The period of repetition of these two signals is about 64 microseconds. The synchronization signal lasts for about 4.6 microseconds and the line video signal lasts for about 59.4 microseconds. The tube produces at least a combination of a first signal which is the synchronization signal and a second signal which is the line video signal.

The synchronization signal is constituted of an approximately rectangular pulse.

The maximum voltage VP max of the synchronization signal is higher than the maximum voltage VPN of the line video signal. The voltage VPN corresponds to the color black.

FIG. 2 represents the voltages VPO and VP as a function of time. The level of the voltage VPN of the video signal at black is indicated. In FIG. 3 have been represented the voltages VG1 and VG2. The two figures are not drawn to the same scale.

The voltage VP is such that the ratio $VP^2/2R$ is equal to the power which should be obtained at the output from the transmitter.

To obtain this voltage VP, the voltage VPO must be greater than VP. In general the ratio VP/VPO is about 0.8.

In negative transmission television systems, the ratio of the maximum voltage of the line video signal VPN to the voltage of the synchronization signal is about 0.73. We obtain:

$$VPN = 0.58 \, VPO$$

This means that the ratio of the power of the line video signal at black to the power of the synchronization signal is $0.73^2$, i.e. 0.53.

A tetrode tube used in a television transmitter providing at output a maximum power of 10 kW conventionally operates with the following voltages:

VPO = 5500
VP max = 4400 V
VPN = 3200 V
VG1 = 100 V
VG2 = 600 V

The tube must function linearly even at a high output power. If not, the non-linearities introduce distortions of the amplitude of the output signal which are a nuisance, especially for color video signals.

The tube's power gain curve must be as straight as possible. This curve represents the power of the tube's output signal as a function of the power of the tube's input signal. The curve can however be permitted to deviate by a few percent for output powers greater than the power of the black level.

For reason of better linearity the tubes used as television transmitters operate as class B amplifiers.

In this class, the efficiency of the tube is given by:

$$n = (\pi/4) \cdot (VP/VPO)$$

For the duration of the synchronization signal an efficiency of n = 63% is obtained.

For the duration of the line video signal, at black, the efficiency falls and we have n = 45%.

As the duration of the line video signal is much longer than the duration of the synchronization signal, the efficiency of the tube is practically the efficiency for the duration of the line video signal and this efficiency is very low.

The cause of the fall in efficiency is the voltage VPO, which is unnecessarily high during the line video signal.

The present invention aims to remedy this disadvantage.

For this purpose it is proposed to reduce the voltage VPO to a level enabling the maximum voltage of the line video signal to be obtained but not the maximum voltage of the synchronization signal. The voltage VPO is chosen so that the line video signal is of good quality, i.e. a good power gain is preserved during the line video signal. Let VP1 be this new anode polarization voltage. This is represented in FIG. 4.

The voltage VP1 is naturally less than the voltage VPO chosen previously.

Consequently, for the duration of the synchronization signal, the power obtained at the output of the transmitter is then insufficient and we observe a fall in gain and poor linearity of the tube. The fall in gain can be as much as 10 to 12%, for example.

To compensate for this fall in gain, the class of the tube is made to tend towards class A for the duration of the synchronization signal. FIG. 4 also shows the voltage VP' of the video signal which is obtained, when a voltage VP1 less than VPO is used and the class of the tube has been made to tend towards class A for the duration of the synchronization signal. The fact that a voltage VP1 is used and that the class of the tube has been made to tend towards class A for the duration of the synchronization signal enables both the maximum voltage VP' max of the synchronization signal and the maximum voltage VPN' of the line video signal to be obtained.

To change the class of a tube, it is necessary only to modify the polarization voltage of at least one of the electrodes of the tube.

It is possible, for example, if a tetrode is used, to raise the polarization voltage VG2 of the screen grid G2, during the synchronization signal. This comes down to pulse modulating the voltage VG2. The modulated voltage VG2' is represented in FIG. 5. The duration of the pulses is the duration of the synchronization signal, they will be approximately rectangular with leading and trailing edges as steep as possible. Their amplitude will be positive. The polarization voltage of the screen grid G2 is not modified.

It would also be possible to raise the anode polarization voltage VP1 during the synchronization signal. This solution is, however, not very useful as it would require the use of a power modulator.

Two or more of the polarization voltages can also be modulated simultaneously.

To modulate a polarization voltage, an appropriate electronic device is used which is activated by the pulses of the synchronization signal.

For a tetrode, for example, it would be possible to vary both the voltage VG1 and the voltage VG2 for the whole duration of the synchronization signal.

When the voltages VG1 and/or VG2 are made to vary, the voltage VP1 is permanently reduced.

If it is supposed that the anode polarization voltage VP1 has been reduced by 15% with respect to the voltage VPO, the voltage level of the line video signal, at black, will be:

$$VPN = 0.8 \times 0.73\ VPO$$

The efficiency of the tube, for the duration of the line video signal at black will then be:

$$n' = (\pi/4)(VPN/VP1) = 54\%$$

The improvement in gain obtained compared with conventional operation is about 20%.

The preferred solution, when working with a tetrode or a tube with more than two grids, is to modulate the polarization voltage VG2 of the screen grid G2. The variation of the voltage VG2 acts as a vernier.

A variation in the polarization voltage VG1 of the control grid has an immediate and sudden effect. Adjustment is then tricky.

A variation dVG1 of the voltage VG1 corresponds to a variation of the anode current and the same variation of the anode current corresponds to a variation dVG2 of the voltage VG2 such that:

$$dVG2 = k\ dVG1$$

k is the coefficient of amplification of the tube measured in a triode and this coefficient is greater than a few units.

A tetrode with a maximum power of 10 kW/ operating with improved efficiency according to the present invention, will be supplied with the following polarization voltages:

VP1:4500 V permanently.
When the polarization voltage of the screen grid G2 is modulated:
VG2' = 700 V during the synchronization signal
VG2' = 600 V during the line video signal
VG1 = −100 V permanently.

When the polarization voltage of the control grid G1 is modulated:
VG1' = −90 V during the synchronization signal
VG1' = −100 V during the line video signal
VG2 = 600 V permanently.

The invention i not restricted to the amplifier tubes used in television transmitters.

It can apply to any amplifier tube operating in class AB, B or C, producing at least a combination of a first short-duration signal and a second longer-duration signal, the maximum voltage of the first signal being higher than the maximum voltage of the second signal.

What is claimed is:

1. Grid amplifier tube with an anode and at least one control grid each supplied with a polarization voltage, producing with an approximately constant gain, at least a combination of a first signal over a short duration and a second signal over a longer duration, the maximum voltage of the first signal being higher than the maximum voltage of the second signal, characterized by the fact that the anode polarization voltage is adjusted to a level enabling the tube to operate in class B, AB or C and to produce the maximum voltage of the second signal but not that of the first signal and wherein means enable the tube to be made to act as a class A amplifier for the duration of the first signal so that it produces the maximum voltage of the first signal.

2. Amplifier tube according to claim 1 wherein the means used to make the tube act as a class A amplifier consist in varying at least one of the polarization voltages.

3. Amplifier tube according to claim 2, wherein the polarization voltage of the control grid is modulated and includes a pulse of positive amplitude for the whole duration of the first signal.

4. Amplifier tube according to either of claims 2 and 3, characterized by the fact that it includes a screen grid connected to a polarization voltage, this polarization voltage being modulated and including a pulse of positive amplitude for the whole duration of the first signal.

5. Amplifier tube according to any one of claims 2 or 3 wherein the anode polarization voltage is modulated and includes a pulse of positive amplitude for the whole duration of the first signal.

6. Amplifier tube according to any one of claims 1 to 3 characterized by the fact that it is used as a television transmitter operating in negative transmission, the first signal being a synchronization signal and the second signal a line video signal.

7. Amplifier tube according to claim 6 wherein the maximum voltage of the line video signal corresponds to the color black.

8. Amplifier tube according to claim 4, wherein the anode polarization voltage is modulated and includes a pulse of positive amplitude for the whole duration of the first signal.

9. Amplifier tube according to claim 4 characterized by the fact that it is used as a television transmitter operating in negative transmission, the first signal being a synchronization signal and the second signal a line video signal.

10. Amplifier tube according to claim 5 characterized by the fact that it is used as a television transmitter operating in negative transmission, the first signal being a synchronization signal and the second signal a line video signal.

* * * * *